(12) United States Patent
Akram et al.

(10) Patent No.: US 6,261,913 B1
(45) Date of Patent: Jul. 17, 2001

(54) METHOD FOR USING THIN SPACERS AND OXIDATION IN GATE OXIDES

(75) Inventors: Salman Akram; Mohamed A. Ditali, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/644,352

(22) Filed: Aug. 23, 2000

(51) Int. Cl.[7] .................................... H01L 21/8234
(52) U.S. Cl. ............................................ 438/305
(58) Field of Search ................... 438/301, 303, 438/305

(56) References Cited

U.S. PATENT DOCUMENTS

| | | |
|---|---|---|
| 5,460,993 * | 10/1995 | Hsu et al. . |
| 5,637,514 * | 6/1997 | Jeng et al. ............................ 438/163 |
| 5,641,698 * | 6/1997 | Lin ....................................... 438/305 |
| 5,719,425 | 2/1998 | Akram et al. . |
| 5,789,298 * | 8/1998 | Gardner et al. ...................... 438/286 |
| 5,866,460 | 2/1999 | Akram et al. . |
| 5,963,814 | 10/1999 | Walker et al. . |
| 5,966,611 | 10/1999 | Jost et al. . |
| 5,970,358 | 10/1999 | Howard . |
| 5,998,274 | 12/1999 | Akram et al. . |
| 6,140,186 * | 10/2000 | Lin et al. ............................ 438/286 |

* cited by examiner

Primary Examiner—Richard Booth
(74) Attorney, Agent, or Firm—TraskBritt

(57) ABSTRACT

A method for forming a lightly doped drain (LDD) field effect transistor uses very thin first sidewall spacers over the gate sidewalls, in which annealing/oxidation of the sidewall spacers results in (a) the rounding of corner portions of the gate structure sidewalls adjacent the gate oxide, and (b) a very low thermal consumption comprising a small portion of the total thermal budget. Secondary sidewall spacers of greater width are then formed to act as offsets in the introduction of N-type dopants into the substrate to form source and drain contact regions. The method may be varied to accommodate various design configurations and size scaling.

10 Claims, 4 Drawing Sheets

METHOD FOR USING THIN SPACERS AND OXIDATION IN GATE OXIDES

BACKGROUND OF THE INVENTION

1. Field

This invention relates generally to integrated circuit devices. More particularly, the instant invention pertains to a multiple implant lightly doped drain ("MILDD") field effect transistor and method of forming the same.

2. State of the Art

Field Effect Transisters ("FET's") are devices of choice in the fabrication of high density integrated circuits. In particular, manufacturers have scaled down FET circuit features to the sub-quarter micron level to achieve the high densities required for gigabit Dynamic Random Access Memories (DRAM's). The reduction of device dimensions results in a number of short-channel effects. One short-channel effect that poses a primary obstacle to further reductions in scale is the "hot-carrier effect."

In an N-channel FET, the hot-carrier effect occurs when the voltage applied between the drain and source regions of the transistor increases to a level at which the high lateral electric field in the transistor channel induces impact ionization. During impact ionization, some electrons are accelerated from the source region to the drain region and collide with the silicon crystal lattice with sufficient kinetic energy to break chemical bonds in the lattice within the channel region of the transistor.

As a result, free hole-electron carrier pairs are generated. The free holes are attracted to the negatively-biased substrate, resulting in a substantial increase in substrate current. At the same time, the free electrons are attracted to the positively-biased transistor gate. Although most of the free electrons completely traverse the gate dielectric layer, some become trapped within the dielectric layer. While the channel-to-substrate current and channel-to-gate current results in increased power dissipation, the injection and trapping of electrons in the gate dielectric is far more serious because it causes the threshold voltage to increase and the current drivability to decrease.

During the operational life of the device, more and more electrons become trapped, resulting in a cumulative degradation of device performance. Over time, the threshold voltage and current drivability characteristics may be degraded to levels that render the circuit inoperable.

Although an analogous process takes place in P-channel devices, it is of less concern in practical applications. In a P-channel device, holes instead of electrons are injected into and become trapped within the gate dielectric. The energy that must be imparted to a hole to cause it to be injected into the gate dielectric is substantially greater than the energy required for electron injection. The lower hole mobility further reduces this effect. Far fewer carriers become trapped in a P-channel device, as compared to an N-channel device operating under similar conditions. As a result, the hot-carrier effect is potentially not as critical for P-channel devices. Accordingly, the discussion below focuses on N-channel devices, with the implicit assumption that analogous principles apply to P-channel devices.

As channel lengths, along with other device dimensions, decrease, the supply voltage does not decrease proportionately. As a result, the lateral electric field in the channel is stronger for a given applied voltage. The stronger lateral field makes the hot-carrier effect more pronounced. In addition, the overall size reduction results in source and drain contact regions which are reduced in dimension. Accordingly, integrated circuit designers strive to reduce the hot-carrier effect in sub-quarter micron scale devices, while simultaneously preventing degradation of current drivability.

In the past decade, designers have taken a number of approaches to mitigate the hot-carrier effect, including: (1) increasing the resistance of gate oxide at the silicon-silicon dioxide ($Si$—$SiO_2$) interface through improved methods of dielectric processing, see Mathews et al., U.S. Pat. No. 5,393,683 (U.S. Class 437/42), issued Feb. 28, 1995, entitled "METHOD OF MAKING SEMICONDUCTOR DEVICES HAVING TWO-LAYER GATE STRUCTURE"; (2) reducing the power supply voltage to reduce the magnitude of the lateral fields, an often difficult or impossible approach; (3) utilizing Lightly Doped Drain ("LDD") FET's; and (4) utilizing other field-reducing device structures.

The most prevalent approach is to use standard LDD FET's. With this approach, the drain and source regions are doped with two different implants, one self-aligned to the gate electrode and the other self-aligned to a sidewall spacer, which permits the implant to be offset from the gate edge. Although this structure results in smaller lateral fields, it often leads to reduced drive currents. Disadvantages of conventional LDD FET's include: (1) increased series resistance between the drain and source regions resulting from the existence of a relatively large lightly doped region adjacent to the channel; (2) spacer-induced degradation, resulting from the injection of carriers into the spacer at the spacer-substrate interface, which results in increased threshold voltage and reduced drive current. Designers have suggested several modifications of the conventional LDD structure to improve its electrical characteristics, with limited success. See, for example, Ahmad et al., U.S. Pat. No. 5,405,791 issued Apr. 11, 1995, entitled "PROCESS FOR FABRICATING ULSI CMOS CIRCUITS USING A SINGLE POLYSILICON GATE LAYER AND DISPOSABLE SPACERS"; Ahmad et al., U.S. Pat. No. 5,382,533 issued Jan. 17, 1995, entitled "METHOD OF MANUFACTURING SMALL GEOMETRY MOS FIELD-EFFECT TRANSISTORS HAVING IMPROVED BARRIER LAYER TO HOT ELECTRON INJECTION"; and Gonzalez, U.S. Pat. No. 5,376,566 issued Dec. 27, 1994, entitled "N-CHANNEL FIELD EFFECT TRANSISTOR HAVING AN OBLIQUE ARSENIC IMPLANT FOR LOWERED SERIES RESISTANCE."

Three United States patents have been issued which relate to the formation of multiple nitride spacers to create a drain region having graduated controlled dopant concentrations. The result is a better controlled electrical field strength over the drain contact region, a generally reduced peak field strength, and reduced hot-carrier effects. These patents, all having the same inventorship and assignment as the instant application, are U.S. Pat. No. 5,719,425 issued Feb. 17, 1998 entitled "MULTIPLE IMPLANT LIGHTLY DOPED (MILDD) FIELD EFFECT TRANSISTOR"; U.S. Pat. No. 5,866,460 issued Feb. 2, 1999 entitled "METHOD OF FORMING A MULTIPLE IMPLANT LIGHTLY DOPED DRAIN (MILDD) FIELD EFFECT TRANSISTOR"; and U.S. Pat. No. 5,998,274 issued Dec. 7, 1999 entitled "METHOD OF FORMING A MULTIPLE IMPLANT LIGHTLY DOPED DRAIN (MILDD) FIELD EFFECT TRANSISTOR."

As disclosed in these three patents, anneal/oxidation of the spacers is performed following the formation of each of a plurality of spacers. These spacers provide varying offset for making source and drain contact regions of graduated dopant concentration. In addition, a spacer may be used for opening the gate dielectric at the contact areas for ohmic conductors. These anneal/oxidation steps are conducted following doping, e.g., N-type doping to form the source and drain regions.

A portion of a prior art transistor formation on a substrate 10 is depicted in drawing FIG. 1, having a gate structure 19 comprising a polysilicon layer 20, metal silicide layer 22 and cap 24 overlying a gate dielectric 14. An oxidation step causes the edges 23 of the polysilicon 20 adjacent the gate dielectric 14 and spacers 26 to oxidize and become rounded. As devices become increasingly smaller, the allowable thermal budget is necessarily decreased to prevent undesirable effects from occurring. One such thermal effect is excessive diffusion of the dopants in the substrate 10, enlarging the contact regions 16 to shorten the channel 15, resulting in hot electron/carrier device degradation and other short-channel operation problems, as well as variability in operational characteristics. The large spacers 26 necessitate a high thermal budget to achieve the desired edge oxidation of the polysilicon 20, but excessive diffusion of contact region dopants also occurs. Thus, in the manufacture of sub-quarter micron scale devices of further reduced scale, a method for preventing short-channel effects such as hot electron/carrier degradation is required.

BRIEF SUMMARY OF THE INVENTION

In the instant invention, a method and apparatus are disclosed for manufacturing a field effect transistor ("FET") in which short-channel effects including a "hot-carrier" effect are mitigated.

The method comprises the formation of a very thin first spacer on the gate structure sidewalls, followed by an oxidation step. A second spacer of greater thickness is then formed on the thin first spacer to enable offset N-type doping of the substrate, and opening of the gate dielectric for connection of ohmic contacts through the gate dielectric to the source and drain regions.

The present invention provides numerous advantages over the prior art LLD structures, including the following: (1) rounding of the corners of the sidewall-gate oxide interface is accomplished at minimal energy expenditure, (2) a lower thermal budget is permitted, preventing undue expansion of the source and/or drain regions by dopant diffusion, (3) short-channel effects including hot-carrier effects are mitigated, leading to better overall reliability and life, (4) current drivability and threshold voltage characteristics are not degraded, (5) no additional masks are required, (6) a reduction of device overlap capacitance is achieved, and (7) the method uses conventional process steps.

DESCRIPTION OF THE DRAWINGS

The following drawings illustrate various embodiments of the invention, wherein.

DESCRIPTION OF THE ILLUSTRATED EMBODIMENTS

Referring to drawing FIGS. 2 through 6, depicted is a fabrication process for a Field Effect Transistor (FET) that corresponds to an embodiment of the present invention.

The following disclosure describes the formation of a single transistor; however, it is understood that in the usual case, a large number of spaced-apart transistors are formed essentially simultaneously on a wafer or wafer portion.

Figure 1:
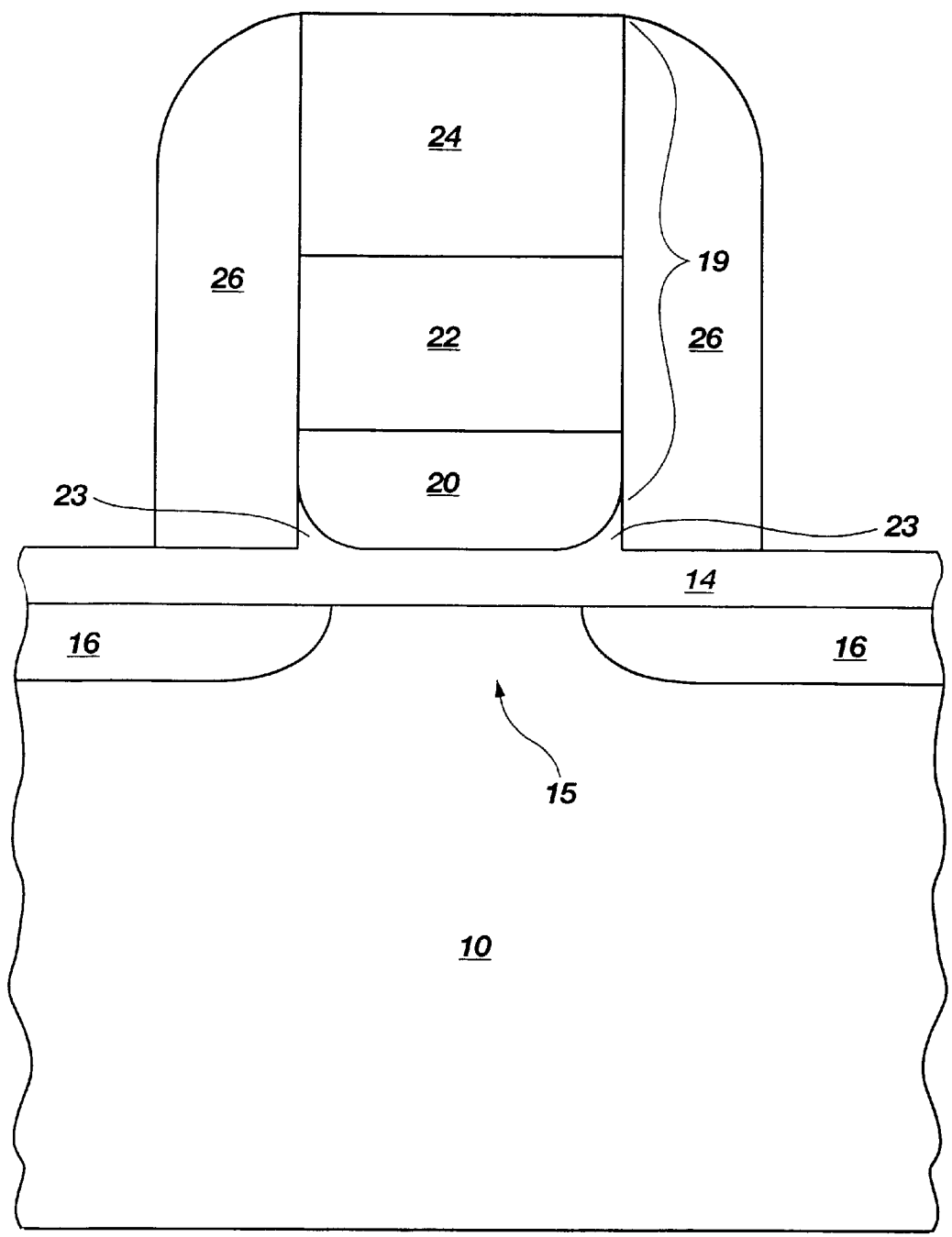
FIG. 1 is a schematic cross-sectional side view of a portion of a semiconductor wafer undergoing a prior art process step using an exemplary gate sidewall spacer to fabricate a transistor.
Figure 2:
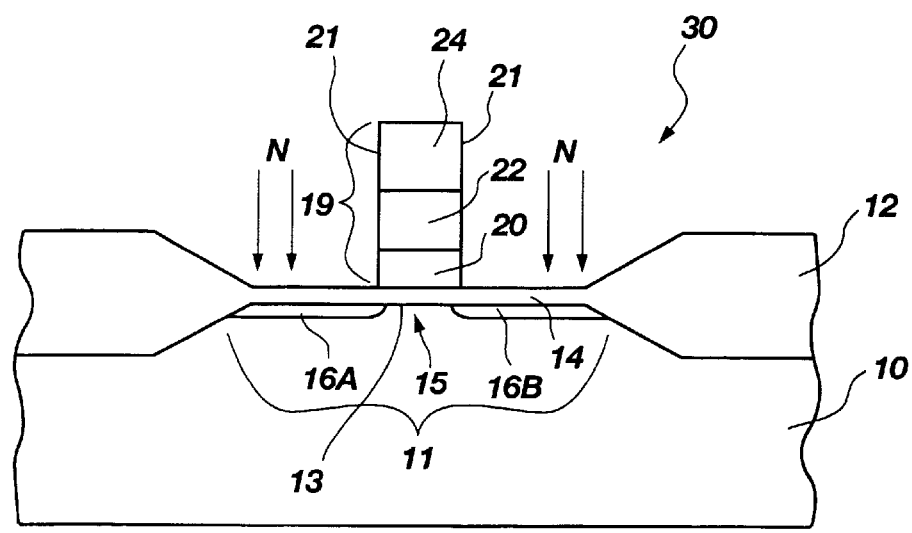
FIG. 2 is a schematic cross-sectional view of a portion of a semiconductor wafer with gate structure thereon undergoing a process flow of the invention to fabricate a transistor.

Referring to drawing FIG. 2, a step in the formation of a field effect transistor (FET) 30 is depicted in a substrate 10 which comprises a semiconductor material, e.g., single crystal silicon, polysilicon ("poly-Si") or amorphous silicon ("a-Si"), typically in wafer form. Substrate 10 has been doped with a P-type impurity, for example, boron. Field oxide 12 has been formed on substrate 10 to electrically isolate active area 11 from other active areas on the wafer. The field oxide 12 comprises silicon dioxide ($SiO_2$) and may be formed by any of several well-known methods, including the standard local oxidation of silicon ("LOCOS") process.

A thin layer of gate dielectric 14 is formed superjacent substrate 10 over active area 11. This invention is especially suitable for ultrathin gate dielectric 14 having a typical thickness of about 80±20 angstroms, or less. Typical gate dielectric 14 will comprise $SiO_2$ that has been formed using one of several well-known methods which result in very low defect density. A gate dielectric 14 comprising several sub-layers is also possible. For example, a layer of silicon nitride ($Si_3N_4$) may be sandwiched between two layers of $SiO_2$; the three layers are collectively referred to as "ONO." In either case, the oxide may be thermally grown, e.g., utilizing rapid thermal oxidation ("RTO"), or deposited, e.g., utilizing chemical vapor deposition ("CVD") or plasma-enhanced chemical vapor deposition ("PECVD").

Subsequent to formation of the gate dielectric 14, a gate structure 19 is formed superjacent gate dielectric 14. Gate structure 19 has sidewalls 21. Gate structure 19 will typically comprise a polysilicon-metal-dielectric stack. For example, a layer of polysilicon 20 is applied superjacent the gate dielectric 14 and has a typical thickness of approximately 1800 Angstroms. Formed superjacent the polysilicon 20 is a metal layer of, e.g., tungsten silicide ("WSi") 22 which has a thickness typically of about 1800 Angstroms. A dielectric cap 24 of, e.g., $Si_3N_4$ is formed superjacent the tungsten silicide 22 and may have a thickness of about 2400 Angstroms for example.

To further reduce the resistance of the metal layer, the single layer of WSi 22 may optionally be replaced by a first sublayer of WSi, no shown, superjacent the polysilicon layer 20, and a second sublayer of tungsten ("W"), not shown, superjacent the WSi sublayer.

Each of the three layers 20, 22 and 24 is formed by first blanket-depositing the appropriate material superjacent the wafer, using a photolithographic mask to define the location of each gate structure 19, and then etching the material from all locations on the wafer other than the location of each gate structure 19. Where the sidewalls 21 are vertical, the same mask may be used for each of the three layers 20, 22, 24 because each layer is aligned with the other two layers.

The metal silicide layer 22 provides the gate structure 19 with high conductivity. One of several alternatives to WSi is titanium silicide ("TiSi$_2$"). Optionally, the single layer of WSi may be replaced with a first sublayer of WSi, not shown and a second sublayer of tungsten ("W"), not shown.

The polysilicon layer 20 acts as a transition layer between two otherwise chemically incompatible layers, namely the gate dielectric layer 14 and the metal silicide layer 22, and also results in improved electrical characteristics of the device.

The dielectric cap 24 protects the gate structure 19 from subsequent processing steps. A nitride cap is preferred over a SiO$_2$ cap, because the latter material is vulnerable to subsequent contact etches of SiO$_2$. Many other gate structure configurations are possible. Variations in methods for fabricating the gate structure 19 are known in the art, and will not be specifically described herein.

The principal purpose of the gate dielectric 14 is to prevent current flow between the gate structure 19 and the substrate 10. However, the gate dielectric 14 is left in place between the gate structure 19 and the field oxide 12 to protect the surface 13 of the substrate 10 from subsequent process steps, i.e., in order to protect the surface's integrity. Additional oxide layers, not shown, may also be deposited to increase the thickness of gate dielectric 14 in areas where process steps, e.g., the introduction of dopants, are to be performed by, e.g., introducing the dopants into the surface 13 of substrate 10. These additional oxide layers can provide improved surface protection during ion implantation process steps, especially when the gate dielectric 14 is relatively thin.

After the gate structure 19 is formed, an N-type dopant is introduced into substrate 10 at those locations on the wafer where the field oxide 12 and the gate structures 19 do not act as barriers to the N-type dopant. The gate structure 19 acts as an "offset" or partial mask to limit dopant penetration in areas of the substrate 10 beneath the gate structure. In this manner, N-type contact subregions 16A, 16B are formed in the P-type substrate 10, where subregion 16A is referred to herein as a "source contact region," and subregion 16B is referred to as a "drain contact region." The term "contact" refers to the fact that a primary purpose of these regions 16A, 16B is ohmic contact of each region to an external interconnect, not shown. The P-type region 15 between the source contact region 16A and drain contact region 16B is hereinafter referred to as a "channel region." The terms "source" and "drain" refer to the flow of electrons when the transistor is "turned ON" and operating in its normal mode, in which case a positive bias is applied to the drain contact region 16B, causing electrons to flow from the source contact region 16A to the drain contact region 16B via the channel region 15. In the example presented herein, the doped drain contact region 16B is termed a "lightly doped drain."

It can be appreciated that as the wafer is subjected to subsequent thermal processing steps, the N-type dopant in the contact subregions 16A, 16B continues to diffuse away from its points of introduction into the substrate 10. It is highly desirable that a manufacturer be able to control with some precision the depth and lateral profile, i.e., outer boundaries of the contact regions 16A, 16B because the expansion of these regions into the P-type substrate 10 can affect the ultimate design parameters of the transistor 30. Generally, shallow contact regions 16A, 16B are preferred because they have to be scaled in accordance with lateral dimensions to maintain adequate device performance.

Therefore, the use of N-type dopants having low diffusion rates is preferred. Suitable N-type dopants include phosphorus (P), arsenic (As), and antimony (Sb). As and Sb are preferred over phosphorus because they have especially low diffusion rates. As is generally preferred over Sb as a dopant because the properties of As are more fully understood, although Sb has a lower diffusion rate than does As at temperatures lower than about 1000° C., and Sb also exhibits a lower autodoping effect.

The N-type dopant is preferably introduced into the substrate 10 by ion implantation. The energy of the implant could range approximately from 20 keV to 130 keV. The preferred energy would range approximately from 30 keV to 100 keV, depending upon the desired junction depth. The dosage will depend upon the dopant concentration that is desired at the edge of the gate structure 19 for the contact regions being created, which in turn will depend upon the device performance and characteristics desired or required for the particular application.

Alternatively, the N-type dopant could be introduced into the substrate 10 by other known means, including plasma doping, in which ions in a plasma are driven into a substrate under the influence of an electrical field, and other diffusion methods.

In a conventional process flow, only one source region 16A and one drain region 16B are formed for each transistor. In a more recent development, a series of source regions and drain regions are sequentially formed. The present invention will be illustrated in terms of a single source region 16A and a single drain region 16B, but may be applied to any number of such regions.

Figure 3:
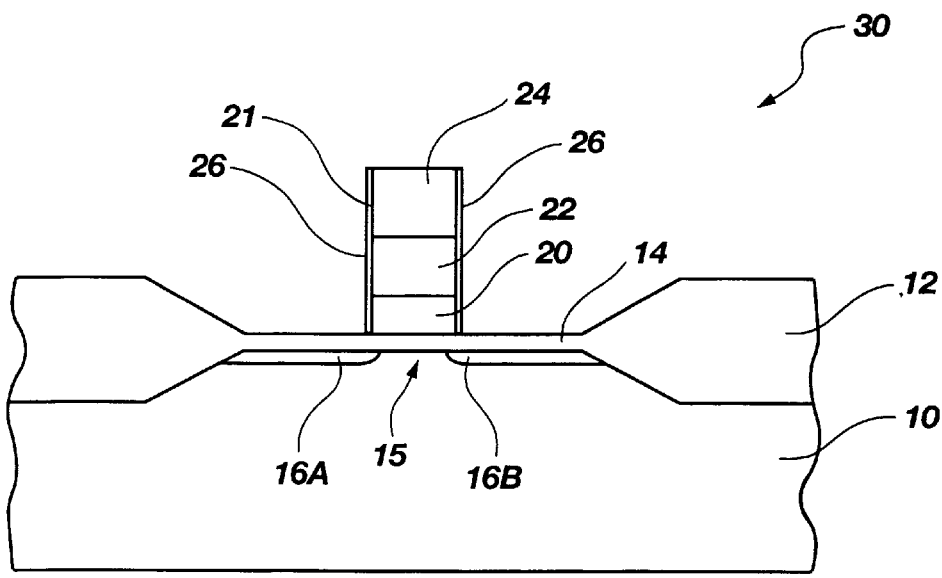
FIG. 3 is a schematic cross-sectional view of a semiconductor wafer undergoing a further step of a process flow of the invention to fabricate a transistor.

In accordance with the present invention, drawing FIG. 3 shows a further step in the production of a FET 30. A first or primary sidewall spacer 26 is formed on one or both gate sidewalls 21. Primary sidewall spacer 26 is preferably formed of a nitride such as Si$_3$N$_4$ because of its resistance to etching during subsequent oxide etch steps, e.g., contact etch steps. The primary spacer 26 may be formed by blanket depositing a thin conformal layer of silicon nitride over the entire wafer and then anisotropically dry etching the entire wafer in the vertical direction. In this manner, all of the nitride is removed except a very thin spacer 26 adjacent the steep vertical sidewalls 21. The primary (first) sidewall spacer(s) 26 will have a very limited thickness of about 100 Angstroms, and typically in the range of between about 50 and 150 Angstroms. As the size scale of field effect transistors 30 is further reduced, the thickness of the primary spacer(s) 26 may be reduced even further.

Figure 4:
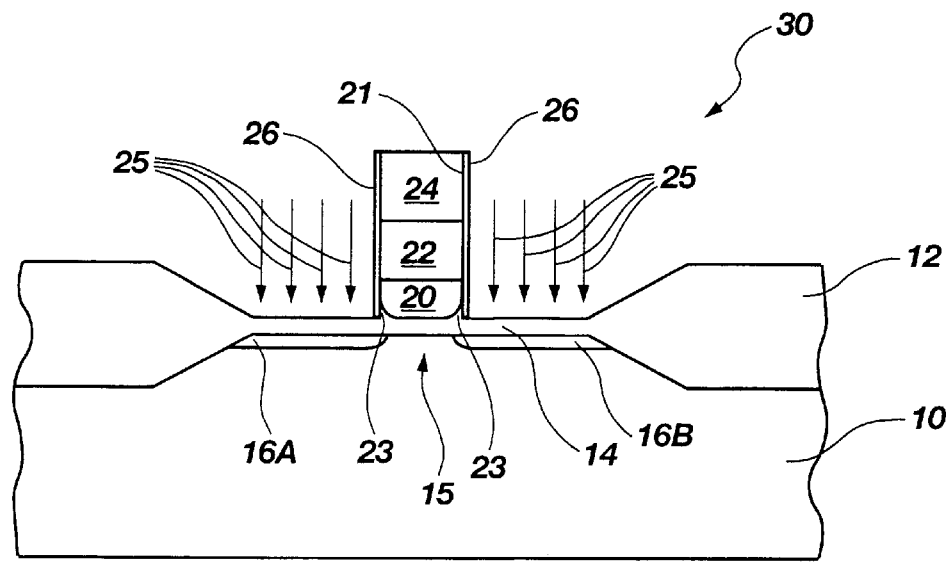
FIG. 4 is a schematic cross-sectional view of a semiconductor wafer undergoing a further step of a process flow of the invention to fabricate a transistor.

As depicted in drawing FIG. 4, formation of the primary sidewall spacers 26 by dry etching is followed by a controlled anneal/oxidation atmosphere 25 to anneal the first spacers 26 and to oxidize and round the corners of the gate oxide-sidewall interfaces, all with a minimum thermal usage. The oxidizing atmosphere 25 results in oxidation and rounding of the corners 23 at the interface between gate dielectric 14, polysilicon layer 20 and primary sidewall spacer 26. Because the primary spacers 26 have such a low mass, the thermal budget of the oxidation step is much lower than would otherwise be the case. The low thermal use minimizes diffusion of N-type dopant from the N-type doped contact regions 16A, 16B into the substrate 10, and the appearance of channel shortening is substantially avoided. Excessive diffusion is of ever-increasing importance as the size of device features is further reduced. A low thermal budget is required for forming the shallow junctions in devices 30 of very small dimensions. The operating characteristics of the device 30 are affected adversely by enlarged contact regions 16A and 16B, including electron trapping and poor leakage characteristics, degraded drive current and non-optimal threshold voltage. Such factors may lead to failure of the device.

Figure 5:
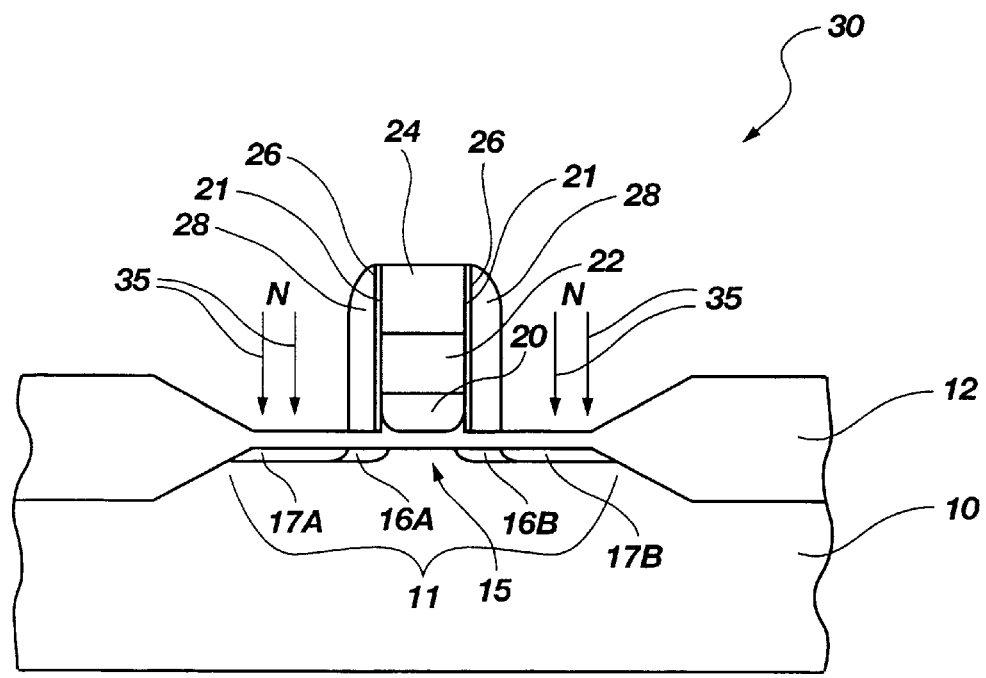
FIG. 5 is a schematic cross-sectional view of a semiconductor wafer undergoing an additional step of a process flow of the invention to fabricate a transistor.

As shown in drawing FIG. 5, following the oxidation step, secondary sidewall spacers 28 are formed over the primary sidewall spacers 26. These secondary sidewall spacers 28 are of greater thickness than the very thin first spacers 26, and in this example have a thickness which provides for light doping of subregions 17A, 17B.

The thickness of second spacers 28 may be conformed to provide the desired contact spacing. Contact spacing is, of course, a function of the scale of the device 30. Typically, the thickness of the secondary sidewall spacer 28 is about 2.0 to 20 times the thickness of the primary sidewall spacer 26, and for example, may be about in the range of 400 to 1000 Angstroms. The secondary sidewall spacers 28 are preferably formed of the same dielectric material as the primary sidewall spacers 26, including silicon oxide and silicon nitride. The latter is preferred because of its resistance to oxide etching (contact etch). The primary purpose of the secondary sidewall spacers 28 is to provide an offset for the subsequent introduction of N-type dopants 35 into the substrate 10. In addition, the second sidewall spacers 28 may have a thickness which locates the ohmic conductors in the desired positions. The dopants 35 may be introduced in one of the same manners as previously noted, including ion implantation, plasma doping, and other doping methods. Where primary or first N-type contact regions 16A, 16B have been previously formed, secondary contact regions 17A, 17B are formed by offset of the secondary sidewall spacers 28. Contact regions 17A, 17B are typically formed to co-occupy portions of contact regions 16A, 16B. Co-occupied portions will have a higher concentration of dopant, having been subjected to two (or more) doping steps rather than one.

As already indicated, the secondary spacers 28 may also be used to open the contact regions for connection to device leads. The spacers 26, 28 may be left in place during subsequent manufacturing steps, and become part of the device.

Figure 6:
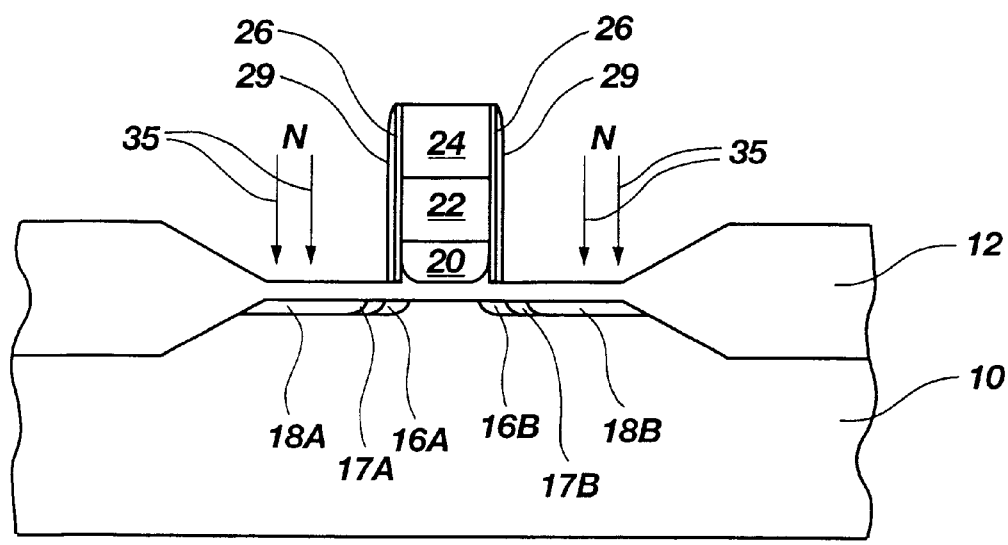
FIG. 6 is a schematic cross-sectional view of a semiconductor wafer undergoing an additional step of a process flow of the invention to fabricate a transistor.

In the illustrated embodiment, shown in drawing FIG. 6, the second spacers 28 may be further etched, resulting in third spacers 29 of thickness intermediate to the first and second spacers. Light doping is then performed, resulting in a series of contact subregions 16A, 16B having low dopant concentrations, contact subregions 17A, 17B having intermediate dopant concentrations and contact subregions 18A, 18B with relatively high dopant concentrations. The latter subregions 18A, 18B have of course been doped three times, subregions 17A, 17B doped twice, and subregions 16A, 16B doped once.

If desired, spacers of further thicknesses may be used to form additional contact subregions of different dopant concentrations.

In a further embodiment of a method of the invention, each spacer in a series of spacers has a greater thickness than the previous spacer. The consecutive order of figures illustrating this embodiment is drawing FIGS. 2, 3, 4, 6, and 5. Further spacers, not illustrated, of even greater thickness, may be used for additional doping of the source and drain regions. The final spacer may be left in the transistor 30 if desired.

Although the present preferred embodiment of the invention has been described in the context of conventional silicon technology, the invention may be used in conjunction with silicon-on insulator ("SOI") wafer technology. In a SOI wafer, the contact subregions could extend all the way through the silicon substrate to the dielectric layer.

Each United States patent referenced herein is hereby incorporated by reference thereto as if set forth in its entirety. Although we have illustrated and described a present preferred embodiment of the invention and variations thereon, the invention is not limited thereto but may be embodied otherwise within the scope of the following claims.

What is claimed is:

1. A method of forming a transistor on a substrate, comprising the following steps:

forming a dielectric layer on a substrate;

forming a gate structure overlying the dielectric layer, the gate structure having a gate oxide layer formed on said dielectric layer, and a metal silicide layer formed on said gate oxide layer, said gate structure having a first sidewall and a second sidewall, whereby a first contact region, a channel region and a second contact region are defined within the substrate by said sidewalls;

forming first, second and third subregions within the second contact region, each subregion having a dopant concentration that differs from that of the other two subregions, wherein the step of forming said subregions comprises the following steps:

forming a first single thin layer sidewall spacer of dielectric material overlying said second sidewall, said first sidewall spacer formed by depositing a thin conformal layer of dielectric material over said wafer, etching to a predetermined thickness over said second sidewall, and subjection to an annealing/oxidation step at an elevated temperature;

forming a second single layer sidewall spacer overlying said first spacer, said second sidewall spacer having a thickness greater than said first sidewall spacer;

introducing a first dopant into the substrate to form said first subregion, said first subregion being generally aligned with said second sidewall spacer;

reducing the thickness of the second sidewall spacer to form a third sidewall spacer having a thickness intermediate said first and second sidewall spacers;

introducing a second dopant into the substrate to form said second subregion, said second subregion being generally aligned with the third sidewall spacer;

substantially removing the third sidewall spacer; and introducing a third dopant into the substrate to form said third subregion, said third subregion being generally aligned with said second sidewall.

2. The method of claim 1, wherein the first sidewall spacer is anisotropically etched to a thickness of between about 50 and 150 Angstroms.

3. The method of claim 1, wherein the second sidewall spacer is etched to a thickness of about 2 to 20 times the thickness of said first sidewall spacer.

4. The method of claim 1, wherein the second sidewall spacer is etched to a thickness of about 550 Angstroms.

5. The method of claim 1, wherein said first sidewall spacer is formed of one of silicon nitride and silicon dioxide.

6. A method of forming a transistor on a substrate, comprising the following steps:

forming a dielectric layer on a substrate;

forming a gate structure overlying the dielectric layer, the gate structure having a gate oxide layer formed on said dielectric layer, and a metal silicide layer formed on said gate oxide layer, said gate structure having a first sidewall and a second sidewall, whereby a first contact region, a channel region and a second contact region are defined within the substrate by said sidewalls;

forming first, second and third subregions within the second contact region, each subregion having a dopant concentration that differs from that of the other two subregions, wherein the step of forming said subregions comprises the following steps:

forming a first single thin layer sidewall spacer of dielectric material overlying said second sidewall, said first sidewall spacer formed by depositing a thin conformal layer of dielectric material over said wafer, etching to a predetermined thickness over said second sidewall, and subjecting to an annealing/oxidation;

forming a second single layer sidewall spacer overlying said first spacer, said second sidewall spacer having a thickness greater than said first sidewall spacer;

introducing a first dopant into the substrate to form said first subregion, said first subregion being generally aligned with said second sidewall spacer;

forming a third single layer sidewall spacer overlying said second spacer, said third sidewall spacer having a thickness greater than said second sidewall spacer;

introducing a second dopant into the substrate to form said second subregion, said second subregion being generally aligned with the third sidewall spacer;

substantially removing the third sidewall spacer; and introducing a third dopant into the substrate to form said third subregion, said third subregion being generally aligned with said second sidewall.

7. The method of claim 6, wherein the first sidewall spacer is anisotropically etched to a thickness of between about 50 and 150 Angstroms.

8. The method of claim 6, herein the second sidewall spacer is etched to a thickness of about 2 to 20 times the thickness of said first sidewall spacer.

9. The method of claim 6, wherein the second sidewall spacer is etched to a thickness of about 550 Angstroms.

10. The method of claim 6, wherein said first sidewall spacer is formed of one of silicon nitride and silicon dioxide.

* * * * *

UNITED STATES PATENT AND TRADEMARK OFFICE
CERTIFICATE OF CORRECTION

PATENT NO.     : 6,261,913 B1
DATED          : July 17, 2001
INVENTOR(S)    : Salman Akram and Mohammed A. Ditah It is certified that error appears in the above-identified patent and that said Letters Patent is hereby corrected as shown below:

Column 3,
Lines 10 and 21, after "polysilicon" and before "20" insert -- layer --

Column 4,
Line 49, after "polysilicon" insert -- layer --
Line 57, change "no shown" to -- not shown --

Column 5,
Line 44, after "P-type" and before "region" insert -- channel --

Column 6,
Line 55, change "corners" to -- edges --
Line 57, after "primary" and before "spacers" insert -- sidewall --
Line 66, change "devices" to -- FET's --

Column 7,
Lines 1 and 14, change "device" to -- FET --
Lines 12, 25 and 44, change "second" to -- secondary sidewall --
Line 38, after "secondary" insert -- sidewall --

Column 8,
Lines 2 and 15, delete "the following steps"
Line 14, delete "the step of"
Lines 18 and 25, after "first" and before "sidewall" insert -- single thin layer --
Line 20, change "wafer" to -- substrate --
Line 24, after "first" insert -- single thin layer -- and before "spacer" insert -- sidewall --
Lines 24, 28 and 29, after "second" and before "sidewall" insert -- single layer --
Line 25, after "first" and before "sidewall" insert -- single thin layer --

Column 9,
Line 14, delete "the step of"
Line 15, delete "the following steps"
Lines 18, after "first" insert -- single thin layer --
Line 20, change "wafer" to -- substrate --
Lines 24 and 25, after "first" insert -- single thin layer --
Lines 24 and 28, after "second" insert -- single layer --

UNITED STATES PATENT AND TRADEMARK OFFICE
CERTIFICATE OF CORRECTION

PATENT NO.   : 6,261,913 B1
DATED        : July 17, 2001
INVENTOR(S)  : Salman Akram and Mohammed A. Ditah It is certified that error appears in the above-identified patent and that said Letters Patent is hereby corrected as shown below:

<u>Column 10,</u>
Lines 30 and 31, after "second" insert -- single layer --
Lines 30, 34 and 35, after "third" insert -- single layer --

Signed and Sealed this

Third Day of June, 2003

JAMES E. ROGAN
*Director of the United States Patent and Trademark Office*